United States Patent
Trimberger et al.

(10) Patent No.: US 7,930,661 B1
(45) Date of Patent: Apr. 19, 2011

(54) SOFTWARE MODEL FOR A HYBRID STACKED FIELD PROGRAMMABLE GATE ARRAY

(75) Inventors: Stephen M. Trimberger, San Jose, CA (US); Arifur Rahman, San Jose, CA (US); Bernard J. New, Carmel Valley, CA (US)

(73) Assignee: Xilinx, Inc., San Jose, CA (US)

(*) Notice: Subject to any disclaimer, the term of this patent is extended or adjusted under 35 U.S.C. 154(b) by 248 days.

(21) Appl. No.: 12/185,511

(22) Filed: Aug. 4, 2008

(51) Int. Cl.
*G06F 17/50* (2006.01)
(52) U.S. Cl. ........................ 716/104; 716/100
(58) Field of Classification Search .............. 716/1, 4, 716/100, 104
See application file for complete search history.

(56) References Cited

U.S. PATENT DOCUMENTS

| | | | |
|---|---|---|---|
| 6,178,494 B1 * | 1/2001 | Casselman | 712/37 |
| 6,614,267 B2 * | 9/2003 | Taguchi | 326/101 |
| 6,875,921 B1 | 4/2005 | Conn | |
| 7,233,061 B1 | 6/2007 | Conn | |
| 7,543,283 B2 * | 6/2009 | Luk et al. | 717/153 |
| 7,619,441 B1 * | 11/2009 | Rahman et al. | 326/38 |
| 7,727,896 B1 * | 6/2010 | Rahman | 438/700 |
| 2002/0066956 A1 * | 6/2002 | Taguchi | 257/734 |

OTHER PUBLICATIONS

U.S. Appl. No. 11/973,062, filed Oct. 4, 2007, Rahman et al.

* cited by examiner

*Primary Examiner* — Jack Chiang
*Assistant Examiner* — Suchin Parihar
(74) *Attorney, Agent, or Firm* — Scott Hewett; LeRoy D. Maunu

(57) ABSTRACT

A software model (620) of a stacked integrated circuit system (600) includes a first integrated circuit die (602) connected to a second integrated circuit die (604) through an interchip communication interface (606). A software model of the first integrated circuit die includes an integrated circuit resource (614) and an internal interface (150). A software model of the second integrated circuit die includes a stacked resource (618). The software model of the internal interface is configurable to connect the stacked resource of the second integrated circuit die to the integrated circuit resource through the interchip communication interface.

15 Claims, 7 Drawing Sheets

US 7,930,661 B1

SOFTWARE MODEL FOR A HYBRID STACKED FIELD PROGRAMMABLE GATE ARRAY

FIELD OF THE INVENTION

This invention relates generally to integrated circuits, and more particularly to techniques for modeling operation of a hybrid integrated circuit having an integrated circuit die stacked on a field programmable gate array.

BACKGROUND OF THE INVENTION

Many integrated circuits ("ICs") are made up of millions of interconnected devices, such as transistors, resistors, capacitors, and diodes, on a single chip of semiconductor substrate. Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. An FPGA may also include various dedicated logic circuits, such as digital clock managers (DCMs), input/output (I/O) transceivers, boundary scan logic, and the like.

FPGA systems have been developed that use one or more ICs in conjunction with the FPGA as a stacked-die functional unit, often referred to as a stacked-die hybrid IC. The second IC might provide additional memory or logic, such as dedicated logic, and be configured to operate with the FPGA through one or more IOBs. Operation of FPGA systems are often limited by I/O resources and associated factors, such as speed and power consumption.

Modeling the stacked-die hybrid IC is necessary to the development and characterization of circuits configured into the programmable fabric of an FPGA and utilizing the full resources of the additional IC. Among other things, modeling involves characterization of the connecting resources in the second IC to the fabric of the FPGA through the IOBs. Techniques for modeling multi-chip FPGA systems providing higher speed and leaving IOBs available for other functionality are desirable.

SUMMARY OF THE INVENTION

Embodiments of the present invention enable modeling of a stacked-die hybrid integrated circuit. Embodiments are enabled to provide high-speed characterization of the interconnections and resources of both an FPGA and one or more stacked dice utilized by configurations programmed into the FPGA.

A software model of a stacked FPGA system includes an FPGA die connected to a second IC die through an interchip communication interface. A software model of the FPGA die includes an FPGA resource and an internal interface. A software model of the second IC die includes a stacked resource. The software model of the internal interface is configurable to connect the stacked resource of the second IC die to the FPGA resource through the interchip communication interface.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

As the number of logic gates per area of silicon increases, technology scaling favors logic density. The density of I/Os and raw bandwidth (Gbps) lags behind the improvements in logic throughput. In other words, the logic:I/O ratio of ICs such as FPGAs, ASICs, and microprocessors has increased with decreasing technology node. In a 90 nm technology, the logic:I/O ratio exceeds 158 in an exemplary integrated circuit, a Field-Programmable Gate Array (FPGA). One way to mitigate the performance restrictions created by the relative abundance of logic functionality compared to I/O density is to provide more on-chip memory. In a particular embodiment, more memory is provided to an FPGA system by stacking a memory die (chip) on an FPGA base die and interconnecting the dies with an array of micro-bump interconnects (typically several hundred to several thousand interconnects). The FPGA base die is loaded with a library of memory resources that includes memory in the base die and memory in the stacked die. The high number of interconnects between the dies provides a high bandwidth integrations, and the FPGA handles the resources of the stacked die in a monolithic fashion.

In a particular embodiment, a DRAM designed to interface with a backside micro-bump array on a base FPGA uses thousands of interconnections between the dies to provide data transfer in the range of Terabits per second. The power consumption of the stacked IC system is estimated to be about $1/100^{th}$ of the power that would have been consumed transferring similar amounts of data between an FPGA and an external DRAM using conventional I/O circuits.

Figure 1:
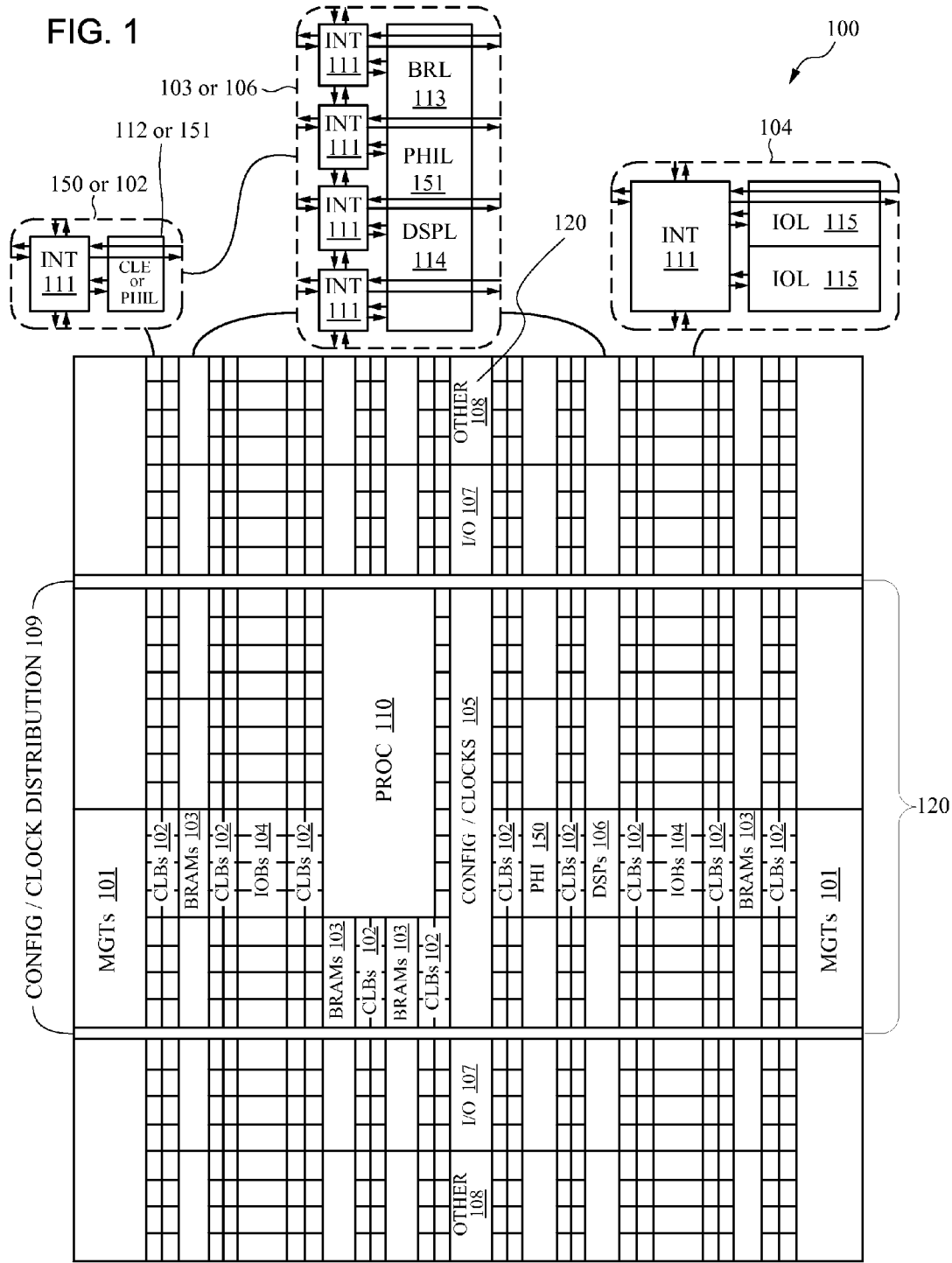
FIG. 1 is a block diagram depicting an exemplary embodiment of an FPGA in accordance with one or more aspects of the invention.

FIG. 1 is a block diagram depicting an exemplary embodiment of an FPGA 100 in accordance with one or more aspects of the invention. The FPGA 100 includes a large number of different programmable, or configurable, tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110). The FPGA 100 also includes one or more programmable heterogeneous integration (PHI) tiles 150. In some embodiments, the FPGA 100 includes a plurality of PHI tiles 150 arranged in a column. In some embodiments, the FPGA 100 includes a plurality of columns of PHI tiles 150. The PHI tiles 150 facilitate interconnection to one or more other ICs stacked on the backside of the die of the FPGA 100.

A PHI tile typically includes one or more programmable interconnect elements, a configurable logic element, interface circuits, selection logic, and a plurality of TDVs. The PHI tile also includes an interface to the routing fabric of the FPGA, and another interface ("PHI interface") to the second IC die (see, e.g., FIG. 2, ref. num. 204). Although only a single column of PHI tiles 150 is shown, it is to be understood that the FPGA architecture 100 may generally include one or more columns of PHI tiles 150. The PHI tile 150 generally includes circuitry and TDVs for providing an interface between the FPGA and one or more additional ICs mounted to the backside of the FPGA.

Each of the programmable interconnect elements 111 includes programmable multiplexing structures that couple the PHI tile 150 to the routing conductor segments of the routing fabric interface. A configurable logic element ("CLE") 112 includes one or more slices of logic having lookup tables (LUTs), multiplexers, flip-flops, and the like, as described above with respect to the CLBs.

Selection logic of the PHI tile 150 is configured to selectively change the function of the PHI tile 150 between a programmable logic tile (e.g., a CLB) and an interface tile. For example, the selection logic may be configured such that signals received from the FPGA routing fabric are coupled to the CLE 112, and signals produced by the CLE 112 are coupled to the FPGA routing fabric. In other words, the selection logic causes the PHI tile 150 to operate similar to a CLB tile (e.g., CLB 102). Alternatively, the selection logic may be configured such that signals received from the FPGA routing fabric are coupled to the second IC die (see FIG. 2, ref. num. 204) through interface circuits and TDVs, and signals produced by the second IC die are coupled to the FPGA routing fabric through the interface circuits and the TDVs. In other words, the selection logic causes the PHI tile 150 to operate as an interface tile between the FPGA routing fabric and the second IC die. The function of the PHI tile 150 as implemented by the selection logic may be controlled by the configuration memory cells of the FPGA (not shown) or by a control signal either external to or internal to the PHI tile 150. Additional details regarding stacked FPGAs, including PHI tile operation, is found in commonly owned U.S. patent application Ser. No. 11/973,062, entitled INTEGRATED CIRCUIT WITH THROUGH-DIE VIA INTERFACE FOR DIE STACKING, filed Oct. 4, 2007 by Arifur Rahman et al., the disclosure of which is hereby incorporated in its entirety for all purposes.

In some embodiments, the IC(s) stacked on the backside of the FPGA die are configurable, such as a second FPGA or a CLD. In other embodiments, the IC(s) are not configurable, but provide additional functionality to the stacked IC, such as providing more RAM, either volatile or non-volatile, ROM, or more logic, such as a co-processor chip or a communications interface. The stacked IC is configured using FPGA configuration frames and FPGA frame addresses that direct the configuration information to the proper location in the proper chip in the stacked IC.

The configuration information is supplied to the stacked chip through vertical connections from the FPGA (e.g., through an array of hundreds, thousands or tens-of-thousands of micro-bumps on the top of the FPGA chip). In a particular embodiment, there are sufficient micro-bumps or other vertical connections (i.e., from the top of the lower die to the bottom of the upper die) to directly connect the entire frame data bus. In a more particular embodiment, the frame data is 1312 bits wide, and at least 1312 microbumps are used to interconnect the stacked dice. Alternatively, the configuration interconnection between the dice uses fewer bumps than the bus width of the FPGA data frame, and data from a data frame is segmented in one device and buffered in the other.

Directly connecting the frame bus between the upper and lower dies allows the upper (stacked) die to be addressed just like it was part of the FPGA. The second IC die can interface directly to the FPGA configuration logic and look like other configuration memory or a configuration source. This way, a stacked non-volatile memory, for example, can be loaded through the FPGA's configuration interface, and it can also configure the FPGA.

A second IC die containing FPGA configuration data can be used to configure the FPGA by having the FPGA read a frame associated with the second IC die (memory), holding the data in the frame data register (FDR), setting the destination address in the frame address register (FAR) and then executing a write to the new frame location. If the configuration logic is modified and if the second IC die drivers are strong enough or if the incoming signals are sufficiently buffered on the FPGA, this can be done as a direct memory access (DMA), writing directly from the second IC die to an on-FPGA frame.

In some FPGAs, each programmable tile includes a programmable interconnect element (INT 111) having standardized connections via routing conductor segments to and from a corresponding interconnect element in each adjacent tile. Therefore, the programmable interconnect elements and routing conductor segments taken together implement the programmable interconnect structure for the illustrated FPGA. The programmable interconnect element (INT 111) also includes the connections to and from the programmable logic element within the same tile, as shown by the examples included at the top of FIG. 1. The programmable interconnect element (INT 111) may also include connections via routing conductor segments to and from a corresponding interconnect element that span multiple columns of logic. That is, routing conductor segments may span a plurality of tiles (e.g., a "hex" line spans six tiles).

For example, a CLB 102 can include a configurable logic element (CLE 112) that can be programmed to implement user logic plus a single programmable interconnect element (INT 111). The CLE 112 includes one or more slices of logic (not shown). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements (e.g., four are shown). A PHI tile 150 includes a PHI logic element (PHIL 151) in addition to an appropriate number of programmable interconnect elements (e.g., four are shown). An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (120 in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA, more than one adjacent column of CLBs is typically included wherever the CLBs appear, to facilitate the efficient implementation of user logic. Examples of FPGAs that may be used with embodiments of the invention include the VIRTEX 5 FPGAs available from XILINX, INC., of San Jose, Calif.

Figure 2:
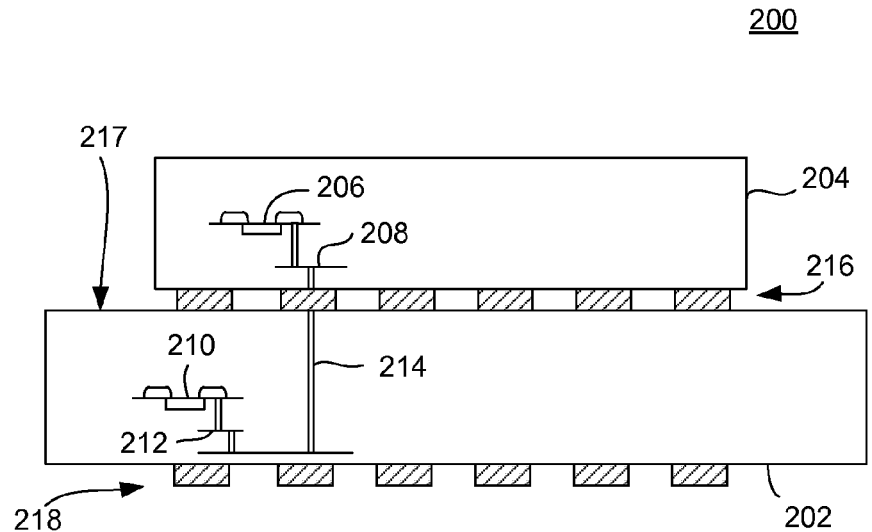
FIG. 2 is a cross-sectional view showing an exemplary embodiment of a semiconductor device in accordance with one or more aspects of the invention.

FIG. 2 is a cross-sectional view showing an exemplary embodiment of a semiconductor device 200 in accordance with one or more aspects of the invention. The semiconductor device 200 includes an FPGA die 202 and a second IC die 204. The semiconductor device including the FPGA die 202 and the second IC die 204 is configured according to an embodiment. The second IC die 204 may comprise any type of digital, analog, or mixed-signal IC. The second IC die 204 is vertically stacked with the FPGA die 202. Each of the die 202, 204 is configured for face-down mounting in flip-chip fashion; however, this is not required for all embodiments. As discussed above, the term "face side" denotes the side of a die that receives the bulk of semiconductor processing such that circuitry is fabricated on that face side of the die. The side of a die opposite the face side is referred to as the backside of the die. Thus, the face side of the second IC die 204 is mounted to the backside of the FPGA die 202.

In particular, the second IC die 204 includes circuitry formed on a semiconductor substrate. A portion of the circuitry is symbolically shown by a transistor 206. The second IC die 204 also includes conductive interconnect formed over the circuitry. A portion 208 of the conductive interconnect is symbolically shown by signal vias coupled to a metal layer.

The FPGA die 202 includes circuitry formed on a semiconductor substrate and conductive interconnects formed over the circuitry, typically in a number of interconnected patterned metal layers. The FPGA die 202 also includes an array of bump contacts 218 formed on the face side for flip-chip mounting to a carrier. A portion of the circuitry is symbolically shown by a transistor 210. A portion 212 of the conductive interconnect is symbolically shown by signal vias coupled to metal layers. The FPGA die 202 also includes a through-die via (TDV) 214 and an array of contacts 216, which in a particular embodiment are an array of several to several thousand fine micro-bumps formed on the backside 217 of the FPGA die 202. The TDV 214 electrically couples the portion 212 of the conductive interconnect to the contacts 216. The TDV 214 extends from the backside of the FPGA die 202 towards the face side of the FPGA die 202 to couple with the conductive interconnect. The width of the TDV 214 depends on the thickness of the semiconductor substrate of the FPGA die 202. For example, for substrates ranging from 10 μm to 100 μm, the width of TDV 214 may range between 2 μm and 15 μm. Fabrication of the TDV 214 is known in the art. (See, for example U.S. Pat. Nos. 6,875,921 "Capacitive Interposer" and 7,233,061 "Interposer for impedance matching", the disclosures of which are hereby incorporated by reference in their entirety for all purposes).

The second IC die 204 is electrically and mechanically coupled to the contacts 216 on the FPGA die by a corresponding array of contacts (not separately shown) on the second IC die. The contacts 216 couple circuitry of the second IC die 204 to the TDV 214. In this manner, circuitry on the second IC die 204 is configured for communication with circuitry on the FPGA die 202. Those skilled in the art will appreciate that the FPGA die 202 may include a plurality of TDVs for coupling electrical signals between circuits on the FPGA die 202 and circuits on the second IC die 204. A PHI tile 150 includes TDVs for providing an interface between FPGA logic and one or more stacked ICs.

Figure 3:
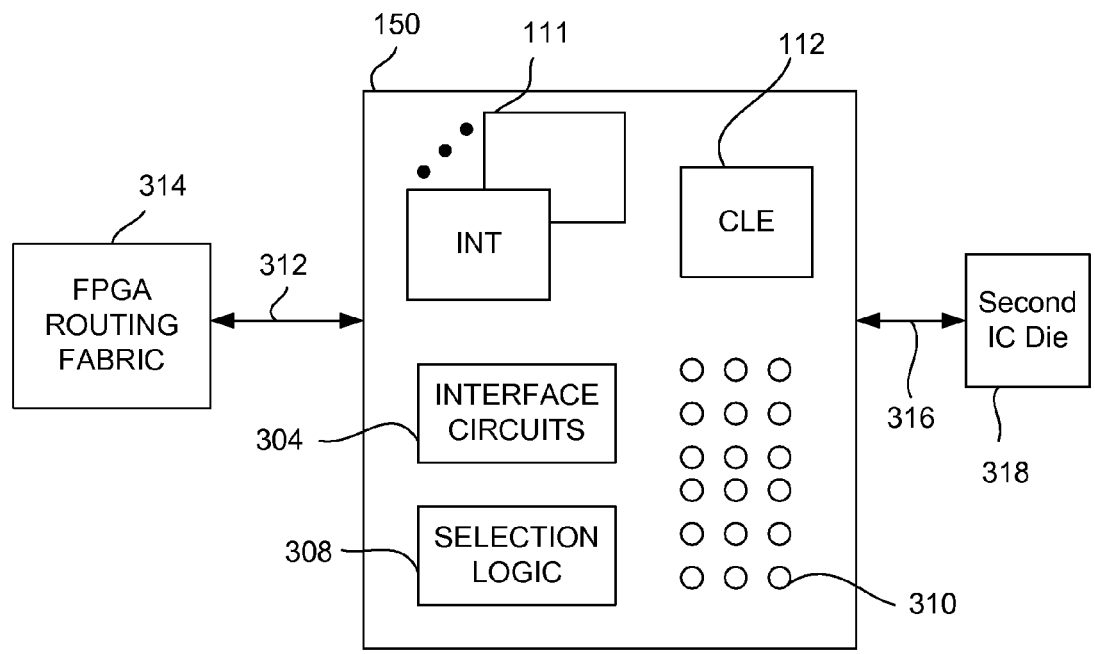
FIG. 3 is a block diagram depicting an exemplary embodiment of an interface tile in accordance with one or more aspects of the invention.

FIG. 3 is a block diagram depicting an exemplary embodiment of a PHI tile 150 in accordance with one or more aspects of the invention. The PHI tile 150 includes one or more programmable interconnect elements 111, a configurable logic element 112, interface circuits 304, selection logic 308, and a plurality of TDVs 310. The PHI tile 300 includes an interface 312 to routing fabric 314 of the FPGA, and an interface 316 with a second IC die 318. The interface 316 includes a plurality of contacts formed on the backside of the FPGA die (e.g., contacts 216 shown in FIG. 2). The contacts of the interface 316 are electrically coupled to conductive interconnect of the second IC die 318 (e.g., interconnect 208 shown in FIG. 2). The interface 312 includes various routing conductor segments that form part of the FPGA routing fabric 314.

Each of the programmable interconnect elements 111 includes programmable multiplexing structures that couple the PHI tile 150 to the routing conductor segments of the interface 312. The configurable logic element 112 includes one or more slices of logic having lookup tables (LUTs), multiplexers, flip-flops, and the like, as described above with respect to the CLBs.

The interface circuits 304 facilitate communication between the FPGA routing fabric 314 and the second IC die 316 through the TDVs 310. The selection logic 308 is configured to selectively change the function of the PHI tile 150 between a programmable logic tile (e.g., a CLB) and an interface tile. For example, the selection logic 308 may be configured such that signals received from the FPGA routing fabric 314 are coupled to the CLE 112, and signals produced by the CLE 112 are coupled to the FPGA routing fabric 314. In other words, the selection logic 308 causes the PHI tile 150 to operate similar to a CLB tile (e.g., CLB 102). Alternatively, the selection logic 308 may be configured such that signals received from the FPGA routing fabric 314 are coupled to the second IC die 318 through the interface circuits 304 and the TDVs 310, and signals produced by the PHI tile 150 are coupled to the FPGA routing fabric 314 through the interface circuits 304 and the TDVs 310. In other words, the selection logic 308 cause the PHI tile 150 to operate as an interface tile between the FPGA routing fabric 314 and the second IC die 318. The function of the PHI tile 150 as implemented by the selection logic 308 may be controlled by the configuration memory cells of the FPGA (not shown) or by a control signal either external to or internal to the PHI tile 150.

In some embodiments, the interface circuits 304 provide voltage level translation. In some cases, the PHI tile 150 and the FPGA may operate using a different supply voltage than the second IC die 318. The voltage of signals originating from the FPGA routing fabric 314 and destined for the second IC die 318 is translated to the voltage required by the second IC die 318. Likewise, the voltage of signals originating from the second IC die 318 and destined for the FPGA routing fabric 314 is translated to the voltage required by the FPGA. In some embodiments, the interface circuits 304 also provide for registering of signals coupled from the FPGA routing fabric 314 to the second IC die 318, and signals coupled from the second IC die 318 to the FPGA routing fabric 314.

The TDVs 310 are electrically coupled to contacts on the backside of the FPGA die (e.g., contacts 216 in FIG. 2). The TDVs 310 are further electrically coupled to integrated circuitry forming the logic of the PHI tile 150 through the conductive interconnect of the FPGA die. As described above, the TDVs 310 enable communication of signals between the PHI tile 150 and the second IC die 318.

Figure 4:
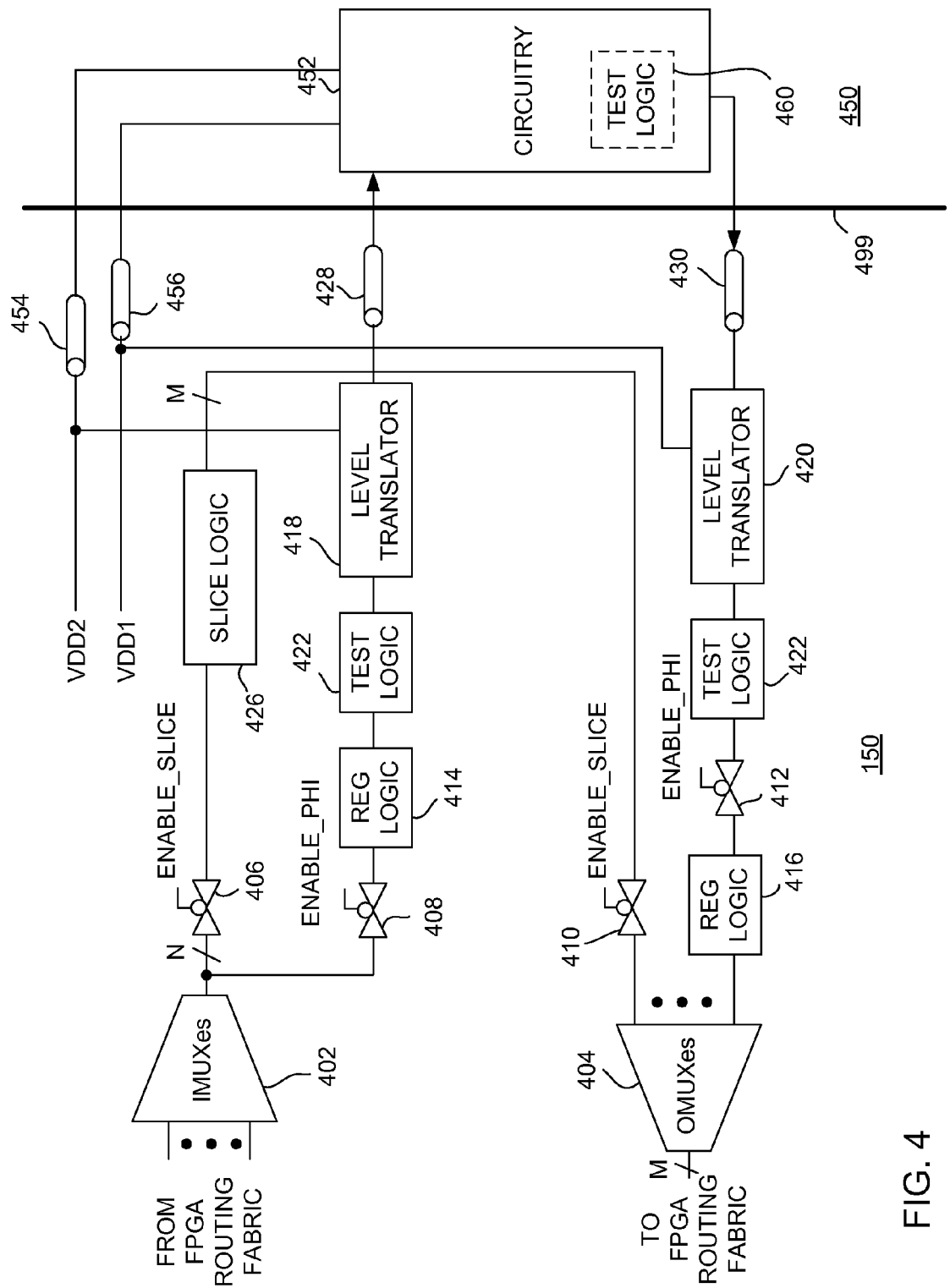
FIG. 4 is a block diagram depicting a more detailed exemplary embodiment of an interface tile in accordance with one or more aspects of the invention.

FIG. 4 is a block diagram depicting a more detailed exemplary embodiment of a PHI tile 150 in accordance with one or more aspects of the invention. In the present embodiment, the PHI tile 150 includes input multiplexing logic (IMUXes 402), output multiplexing logic (OMUXes 404), three-state buffers 406, 408, 410, and 412, register logic 414 and 416, level-translation circuits 418 and 420, test circuitry 422, slice logic 426, and TDVs 428 and 430. With respect to FIG. 3, the three-state buffers 406 through 412 comprise the selection logic 308. The register logic 414, level-translation circuit 418, and test circuitry 422 comprise a first interface circuit. The register logic 416, level-translation circuit 420, and test circuitry 422 comprise a second interface circuit. The IMUXes 402 and OMUXes 404 comprise the programmable interconnect elements. The slice logic 426 comprises the configurable logic element.

Inputs of the IMUXes 402 are coupled to the FPGA routing fabric. An output of the IMUXes 402 is coupled to inputs of the three-state buffers 406 and 408, respectively. The output of the IMUXes 402 illustratively includes N terminals, where N is an integer greater than zero (i.e., the IMUXes 402 include N multiplexers). The IMUXes 402 are configured to couple selected routing conductors of the FPGA routing fabric to the three-state buffers 406 and 408.

An output of the three-state buffer 406 is coupled to an input of the slice logic 426. The slice logic 426 includes a plurality of slices. Each of the slices includes various logic elements, including LUTs, flip-flops, combinatorial logic, and the like. An output of the three-state buffer 408 is coupled to an input of the register logic 414. The register logic 414 includes a plurality of registers (e.g., flip-flops). For example, the register logic 414 may include N flip-flops, one for each terminal of the output of the IMUXes 402.

A control input of the three-state buffer 406 is configured to receive an enable_slice signal. A control input of the three-state buffer 408 is configured to receive an enable_PHI signal. The enable_slice and enable_PHI signals may be generated externally to the PHI tile 150 or may be set by configuration memory cells. If the enable_slice signal is active, the outputs of the IMUXes 402 are coupled to the slice logic 426. If the enable_slice signal is inactive, the three-state buffer 406 provides a high-impedance output for the slice logic 426. Likewise, if the enable_PHI signal is active, the outputs of the IMUXes 402 are coupled to the register logic 414. If the enable_PHI signal is inactive, the three-state buffer 408 provides a high-impedance output for the register logic 414. In this manner, the enable_slice and enable_PHI signals control whether the IMUXes 402 drive the slice logic 426 and/or the register logic 414. In one embodiment, the three-state buffers 406 and 408 are configured such that the IMUXes 402 drive either the slice logic 426 or the register logic 414.

An output of the slice logic 426 is coupled to an input of the three-state buffer 410. The output of the slice logic 426 is illustratively shown as having M terminals, where M is an integer greater than zero. An output of the three-state buffer 410 is coupled to inputs of the OMUXes 404. The OMUXes 404 include M multiplexers. An output of the three-state buffer 412 is coupled to an input of the register logic 416. An output of the register logic 416 is coupled to the inputs of the OMUXes 404. The register logic 416 includes a plurality of registers (e.g., flip-flops). For example, the register logic 416 may include M flip-flops. A control input of the three-state buffer 410 is configured to receive the enable_slice signal. A control input of the three-state buffer 412 is configured to receive the enable_PHI signal. The three-state buffers 410 and 412 operate in a manner similar to the three-state buffers 406 and 408. An output of the OMUXes 404 is coupled to the FPGA routing fabric.

Using the three-state buffers 406-412, the PHI tile 150 may function as a CLB or as an interface tile for interfacing the second IC die 450. The three-state buffers 406 and 410 may be active, causing input signals to pass from the IMUXes 402 through the slice logic 426, and output signals to pass from the slice logic 426 to the OMUXes 404. Alternatively, the three-state buffers 408 and 412 may be active, causing input signals to pass from the IMUXes 402 through the register logic 414, level-translation circuit 418, test circuitry 422, and TDVs 428 to the circuitry 452 on the second IC die 450, and output signals to pass through the TDVs 430, test circuitry 422, level-translation circuit 420, and register logic 416 to the OMUXes 404. In some embodiments, slice logic 426 is omitted. In some embodiments, 3-state buffers 406 and 408 are omitted and inputs are presented to both slice logic 426 and register logic 414. In some embodiments, 3-state buffers 410 and 412 are omitted and OMUXes 404 select the proper output of the slice.

An output of the register logic 414 is coupled to an input of the level-translation circuit 418 through the test circuitry 422. An output of the level translation circuit 418 is coupled to the TDVs 428. The TDVs 428 are electrically coupled circuitry 452 in a second IC die 450. The second IC die 450 is electrically and mechanically coupled to the backside of the die of the FPGA having the PHI tile 150. The circuitry 452 is illustratively configured to receive a pair of voltage supplies, denoted as VDD1 and VDD2. The voltage supplies VDD1 and VDD2 are provided to the second IC die 450 through TDVs 454 and 456, respectively. The TDVs 454 and 456 may be part of the PHI tile 150 or may be located externally to the PHI tile 150. The TDVs 454 and 456 receive the supply voltages VDD1 and VDD2 from external I/O pads of the FPGA or from voltage regulation logic on the FPGA (not shown). A line 499 demarcates the boundary between the FPGA and the second IC die.

Another input of the level-translation circuit 418 is configured to receive the supply voltage VDD2. Assume the FPGA (and hence the PHI tile 150) operates using the voltage supply VDD1, and the circuitry 452 of the second IC die 450 operates using the voltage supply VDD2. The level-translation circuit 418 is configured to translate the voltage of signals received from the register logic 414 from VDD1 to VDD2. This allows the signals provided by the register logic 414 to properly drive the circuitry 452.

In the present example, the TDVs 428 include N TDVs for providing N signals to the circuitry 452 in the second IC die 450. The TDVs 430 include M TDVs for receiving M signals from the circuitry 452 in the second IC die 450. The TDVs 430 are electrically and mechanically coupled to the backside of the die of the FPGA having the PHI tile 150. An input of the level-translation circuit 420 is electrically coupled to the TDVs 430. An output of the level translation circuit 420 is coupled to an input of the three-state buffer 412 through the test logic 422.

Another input of the level-translation circuit 420 is configured to receive the supply voltage VDD1. The level-translation circuit 420 is configured to translate the voltage of signals received from the circuitry 452 in the second IC die 450 from VDD2 to VDD1. This allows the signals provided by the second IC die 450 to properly drive circuitry in the FPGA that uses the VDD1 supply voltage.

Figure 5:
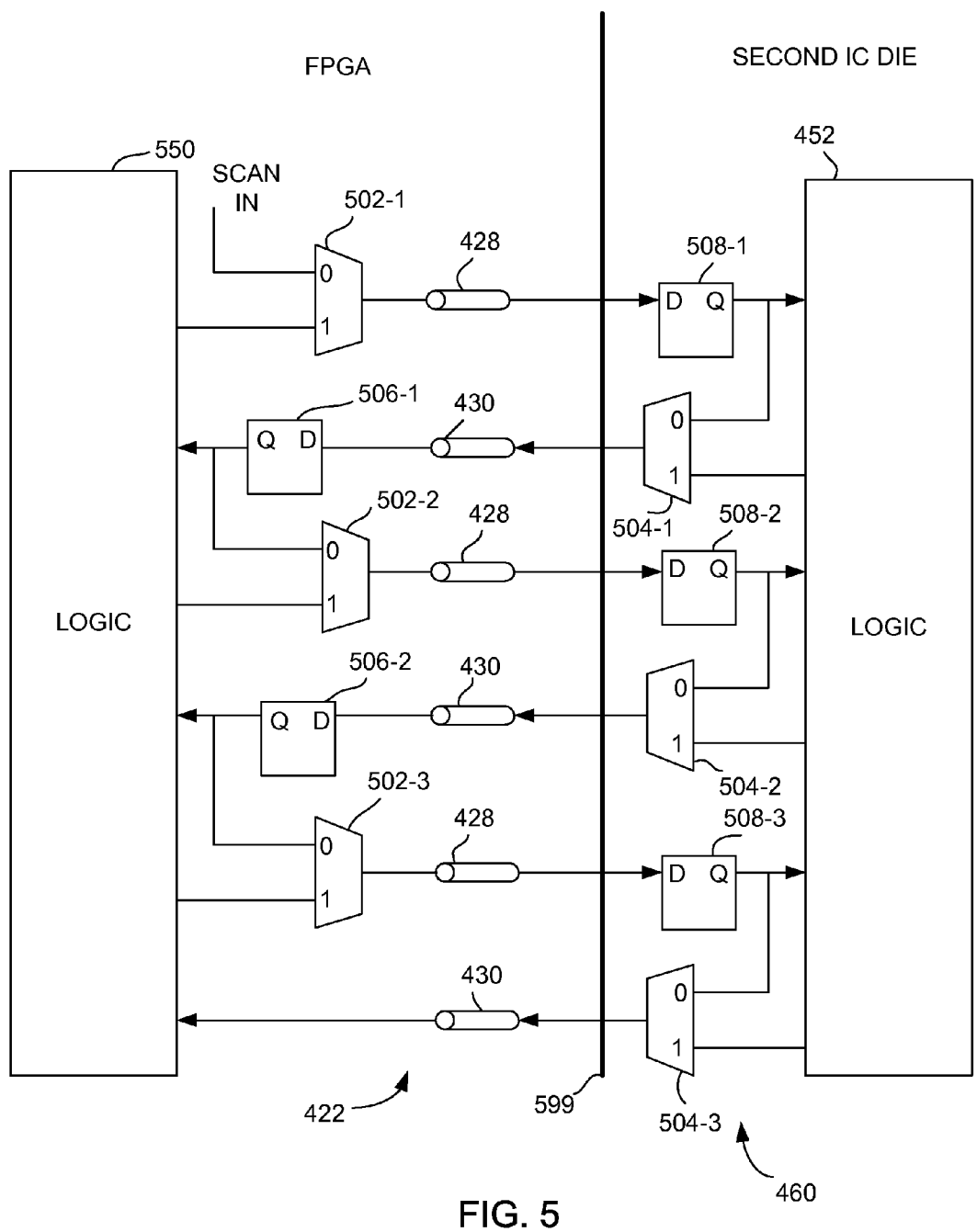
FIG. 5 is a block diagram depicting an exemplary embodiment of test circuitry in an interface tile in accordance with one or more aspects of the invention.

In one embodiment, the test circuitry 422 cooperates with test circuitry 460 on the second IC die 450 to provide a scan chain. Alternatively, the test circuitry 422 may include all circuits for providing the scan chain. Notably, FIG. 5 is a block diagram depicting an exemplary embodiment of the test circuitry 422 in accordance with one or more aspects of the invention. A line 599 demarcates the boundary between the FPGA and the second IC die. In the present example, logic 550 in the FPGA is coupled to the circuitry 452 of the second IC die 450 through the PHI tile 150. Elements of the PHI tile 150 other than the test circuitry 422 have been omitted for clarity.

The test circuitry 422 includes a plurality of multiplexers 502 and a plurality of flip-flops 506. Multiplexers 502-1 through 502-3, and flip-flops 506-1 and 506-2, are shown by example. The test circuitry 460 on the second IC die 450 also includes a plurality of multiplexers 504 and a plurality of flip-flops 508. Multiplexers 504-1 through 504-3, and flip-flops 508-1 through 508-3, are shown by example. One input of each of the multiplexers 502 is configured to receive one of the signals provided by the logic 550 (i.e., one of the N signals provided as input by the PHI tile 150). These inputs are selected if the multiplexers 502 receive a logic '1' control signal. An output of each of the multiplexers 502 is electrically coupled to one of the TDVs 428. In addition, an input of each of the flip-flops 508 (designated as "D") is electrically coupled to one of the TDVs 428. An output of each of the flip-flops 508 (designated as "Q") is coupled to the circuitry 452. The output of each of the flip-flops 508 is also coupled to another input of one of the multiplexers 504. These inputs are selected if the multiplexers 504 receive a logic '0' control signal.

Likewise, one input of each of the multiplexers 504 is configured to receive a signal produced by the circuitry 452 on the second IC die 450. These inputs are selected if the multiplexers 504 receive a logic '1' control signal. An output of each of the multiplexers 504 is electrically coupled to one of the TDVs 430. In addition, an input of each of the flip-flops 506 is electrically coupled to one of the TDVs 430. Outputs of the flip-flops 506 are coupled to the logic 550. The output of each of the flip-flops 506 is also coupled to another input of one of the multiplexers 502. These inputs are selected if the multiplexers 502 receive a logic '0' control signal.

In normal mode, the multiplexers 502 are controlled to pass signals from the logic 550 to the circuitry 452 on the second IC die 450 through the TDVs 428. Likewise, the multiplexers 504 are controlled to pass the signals from the circuitry 452 to the logic 550 through the TDVs 430. In normal mode, the multiplexers 502 and 504 are driven by a logic '1' control signal. During the normal mode, the flip-flops 508 capture output state of the logic 550 and the flip-flops 506 capture output state of the circuitry 452.

In a test mode, the multiplexers 502 and 504 are driven by a logic '0' control signal. The multiplexers 502 are controlled to pass signals from the flip-flops 506, with the exception of the multiplexer 502-1, which selects a scan-in input. The scan-in input may provide a logic '0' or logic '1' input, or may receive input from test logic of another PHI tile in the FPGA. The multiplexers 504 are controlled to pass signals provided by the flip-flops 508. In this manner, the flip-flops 506 and 508 form a serial chain of flip-flops through which data may be shifted. The shifted out data is received by the logic 550 as a serial stream of bits. Thus, the state of the data input to the second IC die 450 and the data output by the second IC die 450 can be captured by the test circuitry 422 and 460.

In another embodiment, the multiplexers 504 and/or the flip-flops 508 are part of the test logic 422. In essence, all or a portion of the test logic 460 may be moved across the boundary 599. This reduces or eliminates special test logic in the second IC die 450. Additional details regarding stacked FPGAs are found in commonly owned U.S. patent application Ser. No. 11/973,012, entitled INTEGRATED CIRCUIT WITH THROUGH-DIE VIA INTERFACE FOR DIE STACKING, filed Oct. 4, 2007 by Arifur Rahman et al., previously incorporated by reference in its entirety for all purposes.

The programmable logic and interconnect of FPGA 100 must be configured to perform a specific function. The configuration logic of FPGA typically includes a configuration controller that receives data from pins on the FPGA typically connected to an external non-volatile storage device, a frame data register (FDR) to temporarily hold one frame of data after that data is read from the pins in preparation for writing to the configuration memory of the FPGA and a frame address register (FAR) indicating where to store data in the frame data register. Typically, the FPGA configuration logic reads data from pins, storing data in the FDR, updates the frame address register and writes to configuration memory cells. This process is repeated until all configuration data is written to configuration memory cells. When an FPGA is stacked with a second IC die, the second IC die may require configuration as well. In this case, the configuration controller may write some configuration data to the second IC die. Alternatively, the second IC die may store configuration data for the FPGA. In this case the configuration controller may read configuration data from the second IC die and write it to the FPGA configuration memory.

Figure 6A:
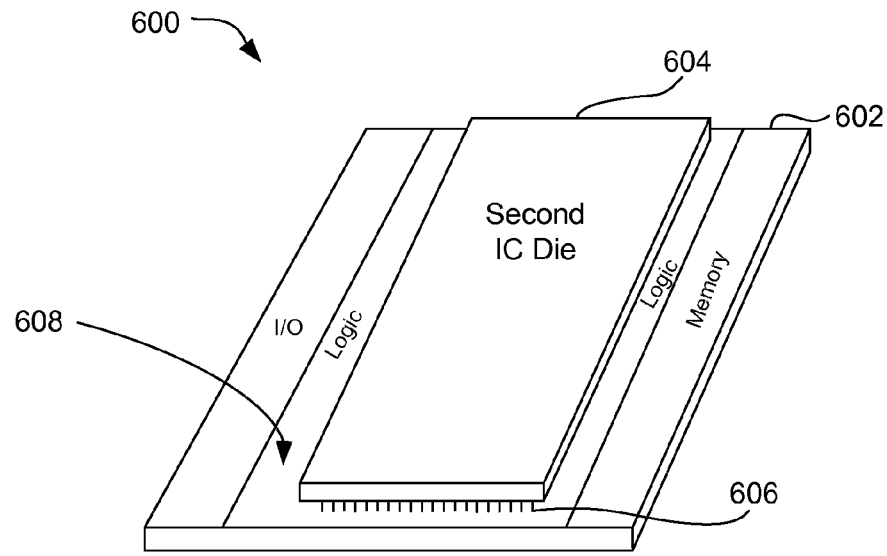
FIG. 6A is an isometric view of an FPGA system suitable for modeling in software according to an embodiment.

FIG. 6A is an isometric view of an FPGA system 600 suitable for modeling in software according to an embodiment. The FPGA system 600 includes an FPGA die 602 and a second IC die 604. In a particular embodiment, the second IC die provides additional logic functionality to the FPGA system and will be referred to as "stacked logic" for convenience of discussion. Alternatively or additionally, the second IC die provides additional memory functionality ("stacked memory") to the FPGA system, such as additional RAM, ROM, or non-volatile RAM, and will be referred to as "stacked memory" for convenience of discussion. The functionality provided to the FPGA system 600 by the second IC die will be generally referred to as "stacked resources", which includes stacked memory, stacked logic, or stacked IOs, for example. In further embodiments, additional dies are stacked on the base die.

An interchip communication interface including an interchip contact array 606 provides electrical connections between the FPGA die 602 and the second IC die 604, and in a particular embodiment includes several hundred to several thousand micro-bumps formed on the backside 608 of the FPGA die 602 connected to a corresponding array of contacts (not shown) formed on the opposing face of the second IC die 604. Exemplary embodiments of interchip contact arrays typically have hundreds to thousands of contacts per interface. In a particular embodiment, the contact arrays are arranged in a columnar fashion (see, e.g., FIG. 1, ref. num. 150). In some embodiments, the interchip contact array is formed on the backside of a flip-chip IC generally in a center portion of the IC die. In alternative embodiments, the interchip contact array is formed in an edge portion of the IC die. In a particular embodiment, an internal interface communication bus of the FPGA has a specified interface com bus width and the interchip communication interface 606 has a number of connections at least equal to the interface com bus width providing high speed data transfer to and from the second IC die, compared to conventional techniques of accessing a second IC through an IOB, which often requires buffering.

The FPGA die 602 accesses stacked resources of the second IC die 604 through one or more internal interconnect tiles, such as a PHIL tile (see, e.g., FIG. 1A, ref. num. 150) without going through I/O blocks of the FPGA. The internal interconnect tile connects stacked resources as though they were physically contained in the FPGA die 602. When modeling the FPGA system, a user models the FPGA die and the second IC die as a single device, with routing to the stacked resources being through the fabric of the FPGA and internal interconnect tiles.

Figure 6B:
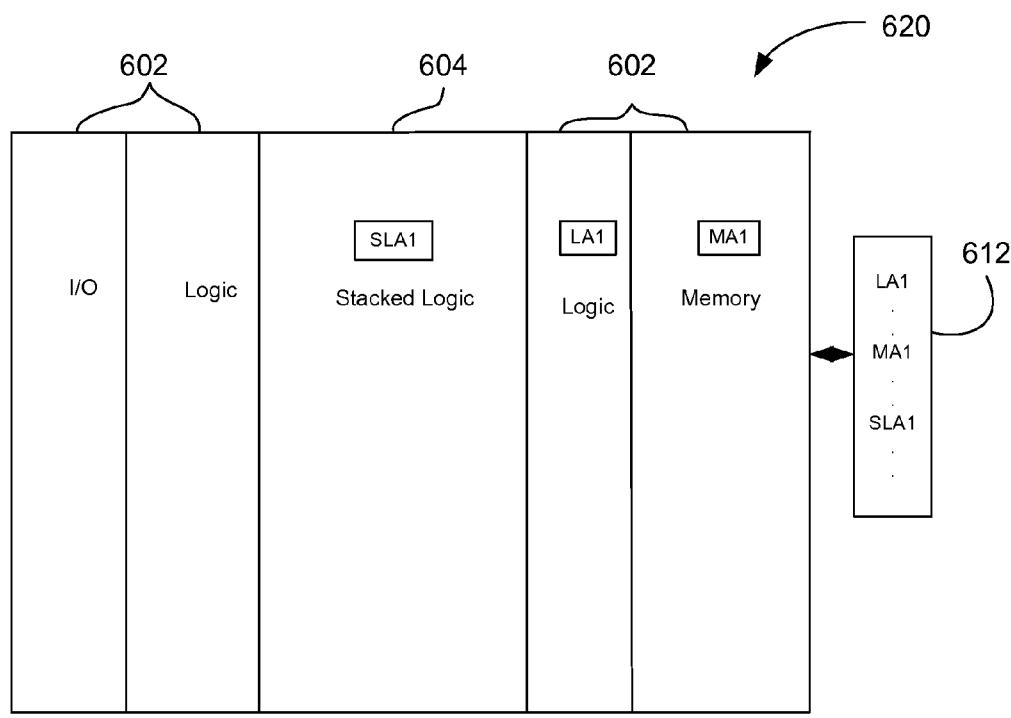
FIG. 6B is diagram of a software model of the FPGA system of FIG. 6A according to an embodiment.

FIG. 6B is diagram of a software model 620 of the FPGA system of FIG. 6A according to an embodiment. The software model 620 is embodied in computer-readable memory of a modeling system (see, e.g., FIG. 6C), several of which are familiar to those of skill in the art, or in a computer-readable storage device, such as a magnetic disk or optical disk. The software model 620 includes a model of an FPGA including FPGA memory, FPGA logic, and FPGA I/O resources. A software model of the second IC die 604 ("Stacked Logic") is incorporated into the software model 620 of the FPGA system. An element library file 612 of resource addresses includes addresses physically within the FPGA die 602, such as memory address MA1 and logic memory address LA1, and one or more resource addresses physically within the second IC die 604, such as stacked logic address SLA 1, and routes from resource locations in the FPGA to resource locations in the second IC die include routes through the interchip communication interface of the FPGA die. The stacked resources are handled as though they were part of the FPGA, i.e. as a single, homogeneous device, and are accessed through the fabric of the FPGA essentially the same as on-chip resources are accessed, using appropriate timing values. Alternatively or additionally, the second IC die includes stacked memory, and the model of the FPGA memory 610 includes a resource address(es) for stacked memory resources (not separately shown), or other stacked resources such as stacked I/Os or stacked IP cores.

The software model 620 includes FPGA resources and second IC die resources accessible through the fabric of the FPGA. In a particular embodiment, the stacked resource(s) is accessed through an internal interface tile of the FPGA, such as a PHI tile. Thus, when the FPGA system is configured to include a stacked resource, access is routed through the internal interface tile and the stacked resource is connected to the fabric of the FPGA essentially the same as an on-chip resource of the FPGA would be connected.

The second IC is modeled as a block(s) in the software model of the FPGA system, basically as a component of the FPGA die would be modeled. The software mapper maps functionality into the second IC die, which is straightforward if the second IC is similar to a component of the FPGA die already included in the software model, such as memory (e.g., a BRAM) or logic. In such cases, the mapper can automatically map into the second IC die. If the second IC is unique or dissimilar from conventional on-chip components in the FPGA software model, an instantiation of the second IC is performed to generate a compatible model, similar to instantiations that are performed for IP cores, for example. The packer model then includes blocks with the stacked component and the placer can place the components of the second IC into the virtual location of the FPGA system corresponding to the interchip communication interface.

Figure 6C:
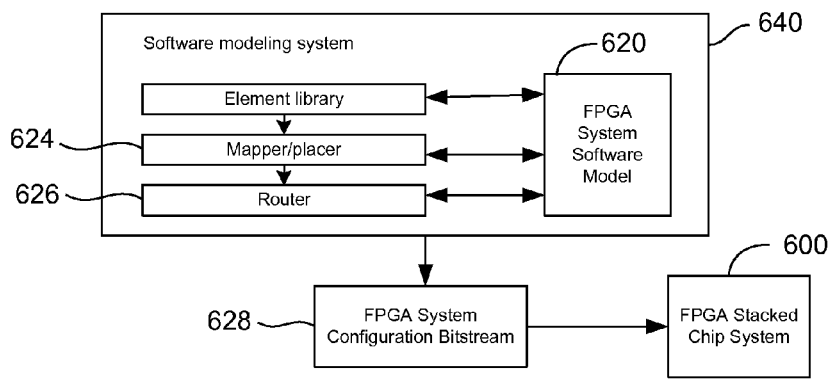
FIG. 6C is a diagram of a software modeling system with a software model of an FPGA system according to an embodiment.

FIG. 6C is a diagram of a software modeling system with a software model of an FPGA system according to an embodiment. The FPGA die includes an internal interface (e.g., one or more PHI tiles) to the second IC die that can be configured to connect the fabric of the FPGA to the stacked resources through the array of interchip contacts, which are modeled essentially as wiring connections in the FPGA die.

The software modeling system basically emulates an application as it would run on a FPGA system configured for the application. The software modeling system typically produces a bitstream used to configure physical FPGA systems when a designer has finished evaluating the FPGA system design. System designs are evaluated by mapping, placing, and routing, as is well understood by those of skill in the art of IC modeling, and optionally include restrictions such as routing, placement, or timing restrictions.

Various types of second IC devices can be stacked on FPGA dies. For example, a first FPGA die might be stacked with additional RAM, and a second FPGA die stacked with ROM, logic, or custom IP. Thus, some software modeling systems include library elements for various types of stacked resources and call the appropriate elements according to the type of second IC included in the FPGA system.

An element library 622 includes FPGA elements and second IC die elements of the FPGA system. In a further embodiment, the element library includes elements from an alternative second IC die that can be stacked on the FPGA to form an alternative FPGA system. A mapper/placer 624 places components of an application into the FPGA system model 620. A router 626 routes the connections between components placed into the FPGA system model. The router routes elements mapped to the second IC through an interface on the FPGA to the second IC, rather than going through an I/O block of the FPGA. In some embodiments, the element library further includes elements placed in the FPGA that are associated with elements placed in the second IC, particularly if the stacked resources are not of a type found in the FPGA. For example, if the second IC contains DRAM that is configured into the FPGA system model, the element library 622 includes a DRAM controller that is mapped and routed in the FPGA die. The software modeling system 640 typically produces a configuration bitstream 628 that is used to configure a physical FPGA stacked chip system.

Figure 7A:
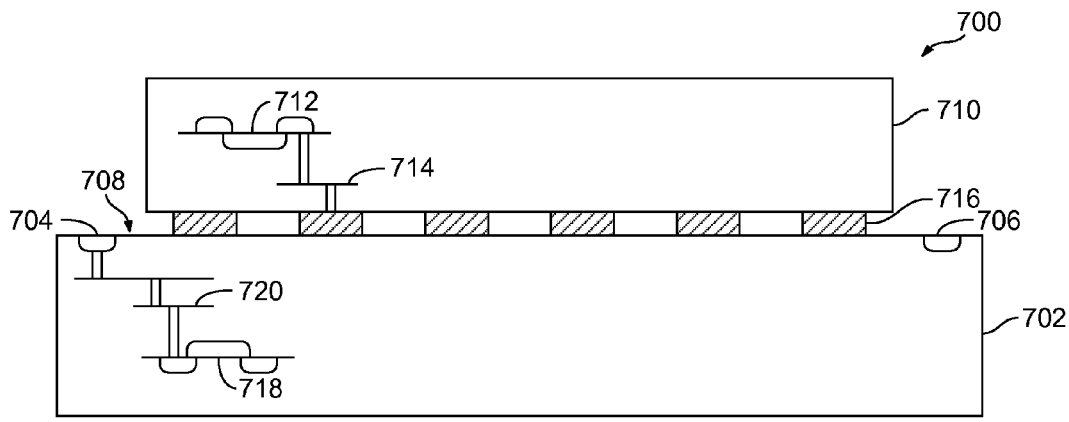
FIG. 7A is a cross-sectional view showing an exemplary embodiment of an FPGA system in accordance with one or more aspects of the invention.

FIG. 7A is a cross-sectional view showing an exemplary embodiment of a semiconductor device 700 in accordance with one or more aspects of the invention. The semiconductor device 700 includes an FPGA die 702 and a second IC die 710. The semiconductor device including the FPGA die 702 and the second IC die 710 is configured according to an embodiment. The second IC die 710 may comprise any type of digital, analog, or mixed-signal IC. The second IC die 710 is vertically stacked with the FPGA die 702. The face side of the second IC die 710 is mounted to the faceside 708 of the FPGA die 702.

In particular, the second IC die 710 includes circuitry formed on a semiconductor substrate. A portion of the circuitry is symbolically shown by a transistor 712. The second IC die 710 also includes a conductive interconnect formed over the circuitry. A portion 714 of the conductive interconnect is symbolically shown by signal vias coupled to a metal layer.

The FPGA die 702 includes circuitry formed in a semiconductor substrate, symbolically represented by a transistor 718, and conductive interconnects formed over the circuitry, typically in a number of interconnected patterned metal layers, symbolically represented by signal vias coupled to a metal layer 720. The FPGA die 702 is an FPGA intended for a wire bonding application. That is, bond wires (not shown) are attached to wire bonding pads 704, 706 on the top side 708 of the FPGA die 702. The bond wires connect the wire bonding pads 704, 706 to bonding areas (not shown) on a carrier, package base (not shown), printed wiring substrate, or other substrate, as is well known in the art of ICs.

The FPGA die 702 also includes an array of contacts 716, which in a particular embodiment are an array of several to several thousand fine micro-bumps formed on the topside 708 of the FPGA die 702. The second IC die 710 is electrically and mechanically coupled to the contacts 716. The contacts 716 couple circuitry of the second IC die 710 to the FPGA die 702. In this manner, circuitry on the second IC die 710 is configured for communication with circuitry on the FPGA die 702 through the contacts 716 that allow accessing resources on the second IC die 710 as though they were physically in the FPGA die, which in a particular embodiment means that the second IC die is accessed without going through an I/O block of the FPGA die. In a particular embodiment, a PHI tile (not shown) in the FPGA die 702 provides an interface between FPGA logic and one or more stacked ICs.

Figure 7B:
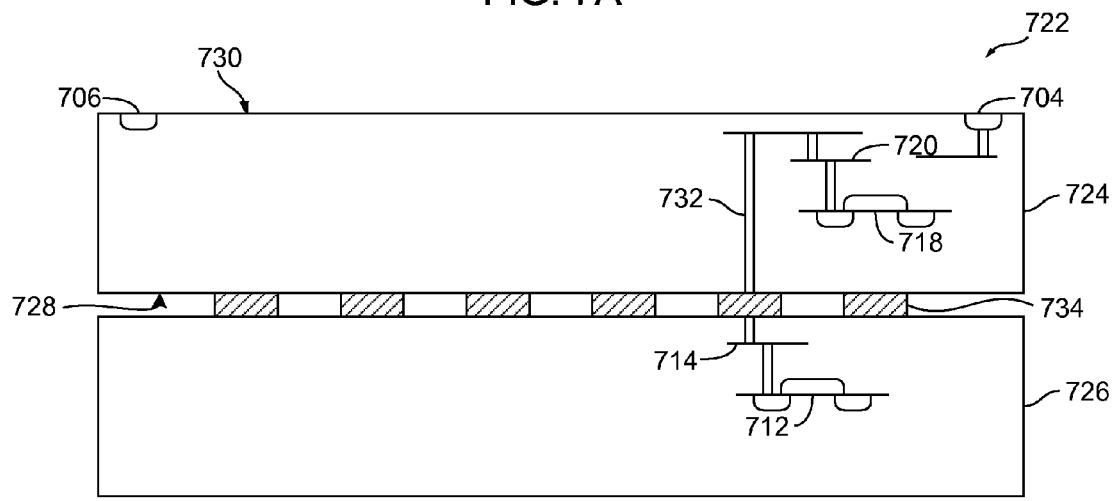
FIG. 7B is a cross-sectional view showing another embodiment of an FPGA system in accordance with one or more aspects of the invention.

FIG. 7B is a cross-sectional view showing another embodiment of a semiconductor device 722 in accordance with one or more aspects of the invention. The semiconductor device 700 includes an FPGA die 724 and a second IC die 726. The second IC die 726 may comprise any type of digital, analog, or mixed-signal IC. The second IC die 726 is vertically stacked with the FPGA die 724. The face side of the second IC die 726 is mounted to the backside 728 of the FPGA die 724.

The second IC die 726 includes circuitry formed on a semiconductor substrate. A portion of the circuitry is symbolically shown by a transistor 712. The second IC die 726 also includes a conductive interconnect formed over the circuitry. A portion 714 of the conductive interconnect is symbolically shown by signal vias coupled to a metal layer.

The FPGA die 724 includes circuitry formed in a semiconductor substrate, symbolically represented by a transistor 718, and conductive interconnects formed over the circuitry, typically in a number of interconnected patterned metal layers, symbolically represented by signal vias coupled to a metal layer 720. The FPGA die 724 is an FPGA intended for a wire bonding application. That is, bond wires (not shown) are attached to wire bonding pads 704, 706 on the top side 730 of the FPGA die 724. The bond wires connect the wire bonding pads 704, 706 to bonding areas (not shown) on a carrier, package base (not shown), printed wiring substrate, or other substrate, as is well known in the art of ICs.

The FPGA die 724 also includes a through-die via (TDV) 732 and an array of contacts 734, which in a particular embodiment are an array of several to several thousand fine micro-bumps formed on the backside 728 of the FPGA die 724. The TDV 732 electrically couples the portion 720 of the conductive interconnect to the contacts 734. The TDV 732 extends from the backside 728 of the FPGA die 724 towards the face side 730 of the FPGA die 724 to couple with the conductive interconnect. The width of the TDV 732 depends on the thickness of the semiconductor substrate of the FPGA die 724. For example, for substrates ranging from 10 μm to 100 μm, the width of TDV 732 may range between 2 μm and 15 μm.

The contacts 734 couple circuitry of the second IC die 726 to the FPGA die 724. In this manner, circuitry on the second IC die 726 is configured for communication with circuitry on the FPGA die 724 through the contacts 734 that allow accessing resources on the second IC die 726 as though they were physically in the FPGA die, which in a particular embodiment means that the second IC die is accessed without going through an I/O block of the FPGA top die. In a particular embodiment, a PHI tile (not shown) in the FPGA die 724 provides an interface between FPGA logic and one or more stacked IC dies.

Figure 8:
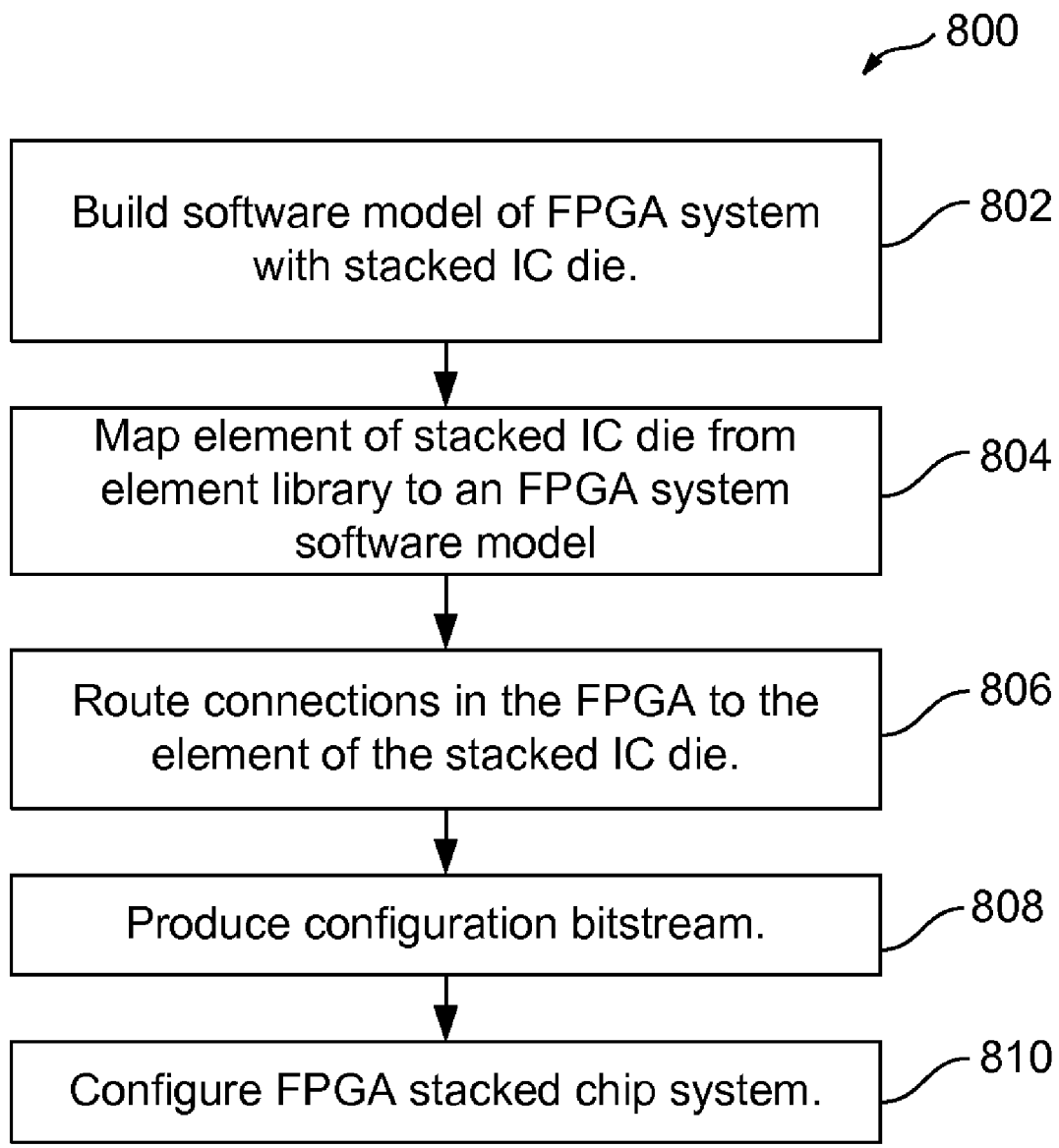
FIG. 8 is a flow chart of a method of modeling an FPGA system according to an embodiment.

FIG. 8 is a flow chart of a method 800 of modeling an FPGA system according to an embodiment. A physical embodiment of an FPGA system includes an FPGA die and a stacked die electrically connected to the FPGA die through an interchip contact array that includes an interchip communication interface. The FPGA die has an intrachip (i.e., internal) communication interface that can access resources in the stacked die through the interchip communication interface without going through an I/O block of the FPGA die. In a particular embodiment, the FPGA die, stacked die, and interchip communication interface are modeled in a software environment using techniques commonly known as device simulation.

The software model of the FPGA system is built on a software model of the FPGA die. In other words, a functional block of the second IC die ("stacked block") is modeled as a component compatible with the FPGA software model (step 802). The stacked component may be similar to components in the FPGA die ("base components"), such as memory blocks or logic blocks, or alternatively different than any component in the FPGA die, such as a unique IP core or DRAM. The term "base components" refers to the fact that the FPGA operates as the basic IC, directing operation of the FPGA system, including access to the stacked components. In some embodiments, a stacked block, such as a DRAM block, operates as an element in conjunction with an FPGA block, such as a DRAM controller configured in the FPGA. Generally, an element is made up of one or more blocks; thus, an element may be physically configured in the FPGA, in the stacked ID, or split between the dies.

A software mapper maps elements including one or more elements of the second IC die from an element library to an FPGA system software model (step 804). Generally, the mapper calls an instantiation of the element from the element library according to user input or automatically according to software. In a particular embodiment, placing an element from the second IC die calls an element to be placed in the FPGA, such as an interface tile or logic associated with the element from the second IC die. In a more particular embodiment, the element of the second IC die is not a base element of the FPGA, and the called element is a block configured in the FPGA to interface with the element of the second IC die. For example, the element of the second IC die is a DRAM, and the called element is a memory controller that is configured in the FPGA. A router routes connections in the FPGA system software model to the element of the second IC die (step 806). In a particular embodiment the route is defined through an internal interface of the FPGA, such as a PHI tile.

In a further embodiment, an FPGA system configuration bitstream is optionally produced from the FPGA system software model (step 808), which is used to configure an FPGA stacked chip system (step 810) according to the FPGA system software model.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A non-transitory computer-readable storage medium configured with software for generating a software model for characterizing a stacked integrated circuit system having a first integrated circuit die and a second integrated circuit die connected to the first integrated circuit die with an interchip communication interface, the software, when executed by a computer, causing the computer to perform steps comprising:
    developing a software model of the first integrated circuit die including an first integrated circuit resource and an internal interface; and
    developing a software model of the second integrated circuit die including a stacked resource, the software model of the internal interface being configurable to connect the stacked resource of the second integrated circuit die to the first integrated circuit resource through the interchip communication interface;
    wherein the stacked resource is connected through an interconnection tile of the first integrated circuit die, and the interconnection tile includes a programmable heterogeneous integration ("PHI") tile.

2. The non-transitory computer-readable storage medium of claim 1 wherein the interconnection tile and the interchip communication interface is in a center portion of the first integrated circuit die.

3. The non-transitory computer-readable storage medium of claim 1 wherein the interchip communication interface is in a logic portion of the first integrated circuit die.

4. The non-transitory computer-readable storage medium of claim 1 wherein the interchip communication interface is modeled as wiring of the first integrated circuit die.

5. The non-transitory computer-readable storage medium of claim 1 wherein the software model models the interchip communication interface as an internal interface communication bus of the first integrated circuit die.

6. The non-transitory computer-readable storage medium of claim 1 wherein the stacked resource is connected to fabric of the first integrated circuit die as a physical resource of the first integrated circuit die.

7. The non-transitory computer-readable storage medium of claim 1 wherein the stacked resource is a type of resource not found on the first integrated circuit die.

8. The non-transitory computer-readable storage medium of claim 1 wherein the stacked resource is a dynamic random access memory ("DRAM") resource.

9. The non-transitory computer-readable storage medium of claim 8 wherein the software model of the first integrated circuit die includes a DRAM controller configured in the first integrated circuit die.

10. A method of modeling an integrated circuit system comprising:
    on a computer, performing steps including:
        developing a software model of a first integrated circuit die having an internal interface tile connectable to an interchip communication interface between the first integrated circuit die and a second integrated circuit die;
        developing a software model of the second integrated circuit die including a stacked resource;
        wherein the stacked resource is connected through an interconnection tile of the first integrated circuit die, and the interconnection tile includes a programmable heterogeneous integration ("PHI") tile;
        combining the software model of the second integrated circuit die with the software model of the first integrated circuit die to produce a software model of the integrated circuit system; and
        emulating operation of the integrated circuit system by configuring the software model of the integrated circuit system according to an application so as to access the stacked resource through the internal interface tile.

11. The method of claim 10 wherein the software model of the first integrated circuit die includes an element library having configurable elements and second integrated circuit die elements.

12. The method of claim 11 wherein the element library further includes third integrated circuit die elements of a third integrated circuit die alternatively connectable to the first integrated circuit die through the interchip communication interface.

13. The method of claim 10 wherein the stacked resource is a type of resource not found on the first integrated circuit die.

14. The method of claim 13 wherein the stacked resource is a dynamic random access memory ("DRAM") and the step of emulating includes configuring a DRAM controller in the first integrated circuit die.

15. The method of claim 10 further comprising producing a bit stream to configure the integrated circuit system according to the application.

* * * * *